United States Patent
Kwon

(10) Patent No.: US 11,628,496 B2
(45) Date of Patent: *Apr. 18, 2023

(54) METHOD OF MANUFACTURING ALUMINUM-BASED CLAD HEAT SINK, AND ALUMINUM-BASED CLAD HEAT SINK MANUFACTURED THEREBY

(71) Applicant: Pukyong National University Industry—University Cooperation Foundation, Busan (KR)

(72) Inventor: Hansang Kwon, Busan (KR)

(73) Assignee: PUKYONG NATIONAL UNIVERSITY INDUSTRY-UNIVERSITY COOPERATION FOUNDATION, Busan (KR)

( * ) Notice: Subject to any disclaimer, the term of this patent is extended or adjusted under 35 U.S.C. 154(b) by 407 days.

This patent is subject to a terminal disclaimer.

(21) Appl. No.: 16/427,622

(22) Filed: May 31, 2019

(65) Prior Publication Data

US 2020/0331066 A1 Oct. 22, 2020

(30) Foreign Application Priority Data

Apr. 16, 2019 (KR) ........................ 10-2019-0044421

(51) Int. Cl.
*B22F 3/20* (2006.01)
*B22F 3/105* (2006.01)
(Continued)

(52) U.S. Cl.
CPC ................ *B22F 3/20* (2013.01); *B22F 3/105* (2013.01); *B22F 7/008* (2013.01); *B22F 9/04* (2013.01);
(Continued)

(58) Field of Classification Search
CPC .... B22F 7/008; B22F 7/02; B22F 7/04; B22F 2007/042; B22F 2007/08
See application file for complete search history.

(56) References Cited

U.S. PATENT DOCUMENTS 3,285,786 A * 11/1966 Katz ...................... H01L 35/34
136/205
4,154,893 A * 5/1979 Goldman ................ B29B 11/10
428/375

(Continued)

FOREIGN PATENT DOCUMENTS

CN 105734322 A * 7/2016
CN 109338167 A * 2/2019

(Continued)

OTHER PUBLICATIONS

K. Dasom., et al.; "Carbon nanotubes-reinforced aluminum alloy functionally graded materials fabricated by powder extrusion process", Materials Science & Engineering, 745, 2019, p. 379-389 (Year: 2019).*

(Continued)

*Primary Examiner* — Sally A Merkling
*Assistant Examiner* — Austin Pollock
(74) *Attorney, Agent, or Firm* — Harness, Dickey & Pierce, P.L.C.

(57) ABSTRACT

Disclosed are a method of manufacturing an aluminum-based clad heat sink, and an aluminum-based clad heat sink manufactured by the method. The method includes ball-milling (i) aluminum or aluminum alloy powder and (ii) carbon nanotubes (CNT) to prepare a composite powder, preparing a multi-layered billet using the composite billet, and directly extruding the multi-layered billet using an extrusion die to produce a heat sink. The method has an advantage of producing a light high-strength high-conductivity aluminum-based clad heat sink having an competitive (Continued)

advantage in terms of price by using direct extrusion that is suitable for mass production due to its simplicity in process procedure and equipment required.

8 Claims, 8 Drawing Sheets

(51) Int. Cl.
*B22F 7/00* (2006.01)
*B22F 9/04* (2006.01)

(52) U.S. Cl.
CPC ... *B22F 2009/043* (2013.01); *B22F 2301/052* (2013.01); *B22F 2302/403* (2013.01); *B22F 2303/40* (2013.01)

(56) References Cited

U.S. PATENT DOCUMENTS

| | | | | |
|---|---|---|---|---|
| 10,480,771 | B1* | 11/2019 | Kim | H01L 33/641 |
| 2004/0020260 | A1* | 2/2004 | Jin | B21C 25/04 |
| | | | | 72/260 |
| 2011/0068299 | A1* | 3/2011 | Hong | C22C 26/00 |
| | | | | 252/182.33 |
| 2012/0164429 | A1* | 6/2012 | Shah | B82Y 30/00 |
| | | | | 428/293.1 |
| 2012/0267141 | A1* | 10/2012 | Kamiyama | C22C 47/062 |
| | | | | 174/102 R |
| 2016/0279709 | A1* | 9/2016 | Xu | B22F 7/02 |
| 2019/0006127 | A1* | 1/2019 | Rodriguez Salinas | |
| | | | | B22F 1/0025 |
| 2019/0122783 | A1* | 4/2019 | Otsuka | C22C 21/00 |
| 2019/0311970 | A1* | 10/2019 | Minami | H01L 23/36 |

FOREIGN PATENT DOCUMENTS

| | | | | |
|---|---|---|---|---|
| JP | S61190006 A | * | 8/1986 | B22F 3/20 |
| KR | 20130028378 A | * | 3/2013 | |
| KR | 101320935 B1 | | 10/2013 | |
| KR | 101329225 B1 | | 11/2013 | |
| KR | 20140068817 A | * | 6/2014 | |
| KR | 20140076448 A | * | 6/2014 | |
| KR | 20160019711 A | * | 2/2016 | |
| KR | 101822073 B1 | * | 1/2018 | |

OTHER PUBLICATIONS

Kwon H. et al., "Fabrication of Functionally Graded Carbon Nanotube-Reinforced Aluminum Matrix Composite", Advanced Engineering Materials, 13, No. 4, 2011, p. 325-329 (Year: 2011).*
Kwon H., et al. "Extrusion of Spark Plasma Sintered Aluminum-Carbon Nanotube Composites at Various Sintering Temperatures", J. of Nanoscience and Nanotechnology, vol. 9, p. 6542-6548, 2009 (Year: 2009).*
Kwon H. et al. "Combination of hot extrusion and spark plasma sintering for producing carbon nanotube reinforced aluminum matrix composites", Carbon, 570-577, 2009 (Year: 2009).*
Yamamoto G., et al.; "A novel structure for carbon nanotube reinforced alumina composites with improved mechanical properties", Nanotechnology, vol. 19, 2008 (Year: 2008).*
Yuuki J., et al.; "Fabrication of Carbon Nanotube Reinforced Aluminum Composite by Powder Extrusion Process", J. Japan Society of Powder Metallurgy, vol. 54, No. 9, (Year: 2007).*

* cited by examiner

METHOD OF MANUFACTURING ALUMINUM-BASED CLAD HEAT SINK, AND ALUMINUM-BASED CLAD HEAT SINK MANUFACTURED THEREBY

CROSS REFERENCE TO RELATED APPLICATION

The present application claims priority to Korean Patent Application No. 10-2019-0044421 (filed Apr. 16, 2019), the entire contents of which is incorporated herein for all purposes by this reference.

FIELD OF THE INVENTION

The present invention relates to a method of manufacturing a heat sink, and a heat sink manufactured by the method. More particularly, the present invention relates to a method of manufacturing an aluminum-based clad heat sink, and an aluminum-based clad heat sink manufactured thereby.

DESCRIPTION OF THE RELATED ART

Generally, electronic parts generate a large amount of heat during operation thereof. Since heat generation of such electronic parts are likely to result in malfunctioning of or damage to the electronic parts, it is required to dissipate the heat generated from the electronic parts. A heat sink with multiple fins is widely used as a heat dissipation device for electronic parts.

Conventionally, a metal material such as aluminum or copper has been used as a material of a heat sink. Among them, aluminum is widely used in various industrial fields. For example, it is used in: airplanes, automobiles, ships, railways, etc. due to its low specific gravity (i.e., lightness); power transmission lines due to its good electric conductivity; industrial tableware and the like due to its strong corrosion resistance in the air and harmless to human body; and paint, aluminum foil packaging, building materials, reactor materials, and so on. Despite many advantages described above, aluminum has a problem in that it is relatively mechanically and physically weak.

Therefore, it is required to develop an aluminum-based heat sink made of a composite material including aluminum and other materials, the composite material having improved corrosion resistance, mechanical characteristics, and processability compared to pure aluminum or aluminum alloys.

DOCUMENT OF RELATED ART

Patent Document (Patent Literature 1) Korean Patent No. 10-1320935 (Oct. 16, 2013)
(Patent Literature 2) Korean Patent No. 10-1329225 (Nov. 7, 2013)

SUMMARY OF THE INVENTION

An object of the present invention is to provide a method of manufacturing a light, high-strength, and high-conductivity aluminum-based clad heat sink having a competitive advantage in terms of price by using direct extrusion which is suitable for mass production due to its simplicity in process procedure and equipment.

Another object of the present invention is to provide an aluminum-based clad heat sink produced by the method described above.

In order to accomplish the objects of the invention, according to one aspect of the invention, there is provided a method of manufacturing an aluminum-based clad heat sink, the method including: (A) preparing a composite powder by ball-milling (i) aluminum or aluminum alloy powder and (ii) carbon nanotubes (CNT); (B) preparing a multi-layered billet including a layer of the composite powder; and (C) directly extruding the multi-layered billet using an extrusion die to produce a heat sink, in which the multi-layered billet includes a core layer and two or more shell layers surrounding the core layer, each of the shell layers except for the outermost shell layer is made of the composite powder, the outermost shell layer is made of (i) the aluminum or aluminum alloy powder or (ii) the composite powder, and the composite powders in the core layer and each of the shell layers contain different volume parts of the carbon nanotubes from each other, with respect to a predetermined volume part of the aluminum or aluminum alloy powder.

The composite powder may contain 100 parts by volume of the aluminum or aluminum alloy powder and 0.01 to 10 parts by volume of the carbon nanotubes.

The ball-milling may be performed at a low speed ranging from 150 to 300 rpm or at a high speed of 300 or more rpm for a duration of 12 hours to 48 hours, in a horizontal or planetary ball mill into which 100 to 1500 parts by volume of milling balls and 10 to 50 parts by volume of an organic solvent with respect to 100 parts by volume of the composite powder are introduced.

The organic solvent may be heptane.

The multi-layered billet may include a core layer, a first shell layer surrounding the core layer, and a second shell layer surrounding the first shell layer.

The multi-layered billet may further include: a first billet that is can-shaped and serves as the second shell layer; a second billet disposed inside the first billet as the first shell layer; and a third billet disposed inside the second billet as the core layer.

The second billet may include 0.09 to 10 parts by volume of the carbon nanotubes with respect to 100 parts by volume of the aluminum or aluminum alloy powder, and the third billet may include 0 to 0.08 parts by volume of the carbon nanotubes with respect to 100 parts by volume of the aluminum or aluminum alloy powder.

In the step (B), the preparing of the billet may include compressing the composite powder at a high pressure of 10 to 100 MPa.

The preparing of the billet comprises subjecting the composite powder to spark plasma sintering performed at a temperature of 280 to 600° C. and a pressure of 30 to 100 MPa for a duration of 1 second to 30 minutes.

According to another aspect of the present invention, there is provided an aluminum-based clad heat sink produced by the method described above.

The heat sink may be of fin type heat or bar type.

The fin type may be a straight fin (SF) type or a pin fin (PF) type.

The manufacturing method according to the present invention is capable of producing a light high-strength high-conductivity aluminum-based clad heat sink having a competitive advantage in terms of price because the manufacturing method is based on direct extrusion which is suitable for mass production due to its simplicity in process procedure and equipment required.

DESCRIPTION OF THE PREFERRED EMBODIMENTS

Figure 1:
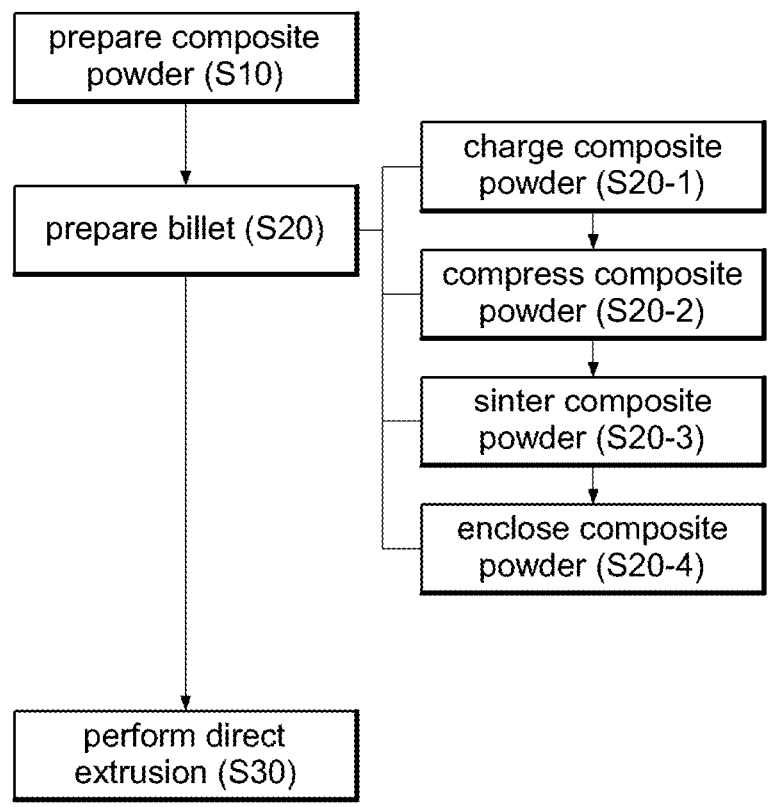
FIG. 1 is a flowchart illustrating a method of manufacturing an aluminum-based clad heat sink according to one embodiment of the present invention.

In describing embodiments of the present invention, well-known functions or constructions will not be described in detail when they may obscure the gist of the present invention.

Embodiments in accordance with the concept of the present invention can undergo various changes to have various forms, and only some specific embodiments are illustrated in the drawings and described in detail in the present disclosure. While specific embodiments of the present invention are described herein below, they are only for illustrative purposes and should not be construed as limiting to the present invention. Accordingly, the present invention should be construed to cover not only the specific embodiments but also cover all modifications, equivalents, and substitutions that fall within the concept and technical spirit of the present invention.

The terminology used herein is for the purpose of describing particular embodiments only and is not intended to limit the scope of the present invention. As used herein, the singular forms "a", "an", and "the" are intended to include the plural forms as well unless the context clearly indicates otherwise. It will be further understood that the terms "comprises", "includes", or "has" when used in the present disclosure specify the presence of stated features, regions, integers, steps, operations, elements and/or components, but do not preclude the presence or addition of one or more other features, regions, integers, steps, operations, elements, components and/or combinations thereof.

Hereinafter, embodiments of the present invention will be described.

FIG. 1 is a flowchart illustrating a method of manufacturing an aluminum-based clad heat sink according to one embodiment of the present invention.

Hereinafter, the method of manufacturing an aluminum-based clad heat sink, according to one embodiment of the present invention, will be described with reference to FIG. 1.

Referring to FIG. 1, the manufacturing method according to one embodiment of the present invention includes: a composite powder preparation step S10 of preparing a composite powder by ball-milling (a) aluminum or aluminum alloy powder and (b) carbon nanotubes (CNT); a billet preparation step S20 of preparing a multi-layered billet using the composite powder, and a direct extrusion step S30 of directly extruding the multi-layered billet using an extrusion die.

First, aluminum or aluminum alloy powder and carbon nanotubes (CNT) are ball-milled to produce a composite powder in step S10.

The aluminum alloy powder is powder of any one aluminum alloy selected from the group consisting of 1000 series, 2000 series, 3000 series, 4000 series, 5000 series, 6000 series, 7000 series, and 8000 series.

Since the composite powder contains the carbon nanotubes, the aluminum-based clad heat sink made of the composite powder is light and has high thermal conductivity and strength. Thus, this heat sink is very useful as a heat dissipation member for various electronic parts and lighting devices.

The composite powder may contain an additional metal powder in addition to the aluminum powder. The additional metal powder is the powder of any metal selected from the group consisting of copper, magnesium, titanium, stainless steel, tungsten, cobalt, nickel, tin, and alloys thereof.

When preparing the composite powder, there are problems that micro-sized aluminum or aluminum alloy particles are difficult to disperse due to a large size difference from nano-sized carbon nanotubes and the carbon nanotubes easily agglomerate by a strong Van der Waals force. Therefore, a dispersion agent is added to uniformly blend the carbon nanotubes and the aluminum particles or aluminum alloy particles.

The dispersion agent is a nano-sized ceramic selected from the group consisting of nano-SiC, nano-$SiO_2$, nano-$Al_2O_3$, nano-$TiO_2$, nano-$Fe_3O_4$, nano-MgO, nano-$ZrO_2$, and mixtures thereof.

The nano-sized ceramic particles uniformly disperse the carbon nanotubes among the aluminum particles or aluminum alloy particles. Since the nano-sized silicon carbide (SiC) has high tensile strength, sharpness, constant electrical conductivity, constant thermal conductivity, high hardness, high fire resistance, high resistance to a thermal shock, and high chemical stability at high temperatures, it is widely used as an abrasive or a fireproofing agent. In addition, the nano-sized SiC particles present on the surfaces of the aluminum particles have a function of preventing direct contact between the carbon nanotubes and the aluminum particles or aluminum alloy particles to inhibit formation of undesirable aluminum carbide which is formed through reaction between the carbon nanotubes and the aluminum particles or aluminum alloy particles.

The composite powder may include 100 parts by volume of the aluminum powder or aluminum alloy powder and 0.01 part by volume of the carbon nanotubes.

When the content of the carbon nanotubes is less than 0.01 part by volume with respect to 100 parts by volume of the aluminum powder or aluminum alloy powder, the strength of an aluminum-based clad heat sink made from the composite powder is similar to that of a pure aluminum clad heat sink or an aluminum alloy clad heat sink. That is, in that range of the content of the carbon nanotubes, the composite power cannot play a role as a reinforcing material. Conversely, when the content exceeds 10 parts by volume, there is a disadvantage in that an elongation decreases although the strength of an aluminum-based clad heat sink made from the composite power is higher than that of a pure aluminum or aluminum alloy clad heat sink. In addition, when the content of the carbon nanotubes is excessively large, the carbon nanotubes hinder dispersion of the aluminum particles and degrade mechanical and physical properties of the product by serving as defect sites.

When the dispersion agent is included in the composite powder, the composite powder contains 0.1 to 10 parts by volume of the dispersion agent with respect to 100 parts by volume of the aluminum powder.

When the content of the dispersion agent is less than 0.1 part by volume with respect to 100 parts by volume of the aluminum powder, the dispersion inducing effect is insignificant. Conversely, when the content exceeds 10 parts by volume, the dispersion agent rather hinders dispersion of the aluminum particles because it causes the carbon nanotubes to agglomerate.

A horizontal or planetary ball mill is used for the ball milling. The ball milling is performed in a nitrogen or argon ambient at a low speed ranging from 150 to 300 rpm or a high speed of 300 or more rpm for a duration of 12 to 48 hours.

The ball milling begins by charging 100 to 1500 parts by volume of stainless steel balls (a 1:1 mixture of balls with a diameter of 10 mm and balls with a diameter of 20 mm) into a stainless steel container with respect to 100 parts by volume of the composite powder.

To reduce the coefficient of friction, any one organic solvent selected from the group consisting of heptane, hexane, and alcohol is used as a process control agent. In this case, the process control agent is added by 10 to 50 parts by volume with respect to 100 parts by volume of the composite powder. After the completion of the ball milling, the stainless steel container is opened so that the organic solvent can be volatilized, leaving only a mixture of the aluminum powder and the carbon nanotubes.

The dispersion agent (herein, nano-sized ceramic particles) plays the same role as nano-sized milling balls due to the rotational force generated during the ball milling, thereby physically separating the agglomerated carbon nanotubes from each other and improving the fluidity of the carbon nanotubes. Thus, the carbon nanotubes can be uniformly dispersed on the surfaces of the aluminum particles.

Next, a multi-layered billet is made from the obtained composite powder in step S20.

The multi-layered billet produced in this step comprises a core layer and at least two shell layers surrounding the core layer. The shell layers except for the outermost shell layer are made of the composite powder. The outermost shell layer is made of (i) the aluminum or aluminum alloy powder or (ii) the composite powder. The composite powders contained in the core layer and each of the shell layers have different volume parts of carbon nanotubes with respect to a predetermined volume part of the aluminum or aluminum alloy powder.

The number of the shell layers included in the multi-layered billet is not particularly limited, but it is preferably 5 or less in terms of cost efficiency.

Figure 2:
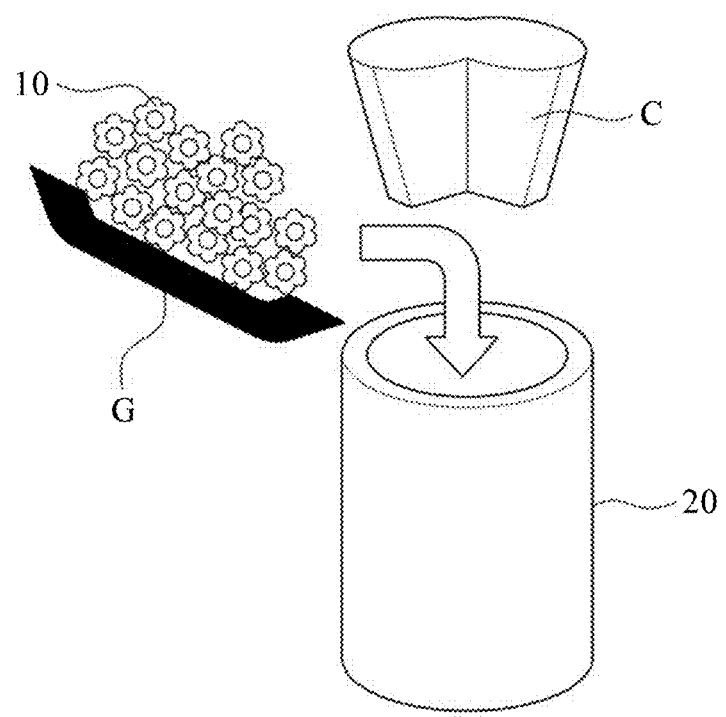
FIG. 2 is a diagram schematically illustrating a billet preparation process.

FIG. 2 is a diagram schematically illustrating a multi-layered billet preparation process. Referring to FIG. 2, the billet is prepared by charging the composite powder 10 into a metal can 20 through a guider G in step S20-1. The metal can 20 is closed with a cap C or the composite powder in the metal can 20 is compressed so that the composite power cannot flow out of the metal can 20 in step S20-4.

The metal can 20 is made of any metal being thermally and electrically conductive. Preferably, the metal can 20 is made of aluminum, copper, or magnesium. The thickness of the metal can 20 ranges from 0.5 to 150 mm when a 6-inch billet is used, but it varies depending on the size of the billet used.

Figure 3:
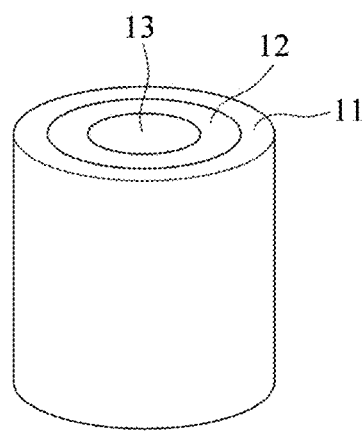
FIG. 3 is a perspective view schematically illustrating an example of a multi-layered billet.

FIG. 3 is a diagram illustrating an example of the multi-layered billet. The example of the multi-layered billet includes a core layer and two shell layers surrounding the core layer. Specifically, the multi-layered billet includes a core layer, a first shell layer surrounding the core layer, and a second shell layer surrounding the first shell layer.

Referring to FIG. 3, a second billet 12 serving as the first shell layer is disposed in a first billet 11 having a hollow cylindrical shape, serving as the second shell layer (i.e., the outermost shell layer), and made of a material having a composition different from that of the second billet, and a third billet 13 having a composition different from that of the second billet 12 is disposed in the second billet 12 as the core layer to form the multi-layered billet.

The first billet 11 has a hollow cylindrical shape. That is, the first billet 11 is in the form of a can with one end closed or in the form of a hollow cylinder with both ends being open. The first billet 11 is made of aluminum, copper, magnesium, or the like. The first billet 11 having a hollow cylinder shape is manufactured by melting a base metal and injecting molten metal into a mold. Alternatively, it can be manufactured by machining a metal block.

The second billet 12 includes the prepared composite powder. The second billet 12 is in the form of a mass or powder.

When the second billet 12 is in the form of a mass, the second billet 12 specifically has a cylinder shape. The composite billet is prepared by placing the cylindrical second billet 12 in the first billet 11. To prepare the multi-layered billet in which the second billet 12 is placed in the first billet 11, the composite powder to form the second billet 12 is melted, the molten material is injected into a mold to form a cylindrical shape, and the cylindrical shape is press-fitted into the first billet 11. Alternatively, the composite powder is directly charged into the cavity of the first billet 11.

The third billet 13 is a metal mass or metal powder.

When the second billet 12, the third billet 13, or both are in the form of a mass of the composite powder, the mass of the composite powder is produced by compressing the composite powder at a high pressure or sintering the composite powder.

In this case, the composite powder of the second billet and the composite powder of the third billet 13 have different volume parts of the carbon nanotubes with respect to 100 parts by volume of the aluminum power or the aluminum alloy powder. That is, in FIG. 3, the value of the volume parts of the carbon nanotubes with respect to 100 parts by volume of the aluminum or aluminum alloy in the second billet 12 may differ from that in the third billet 13.

The composite powder of the second billet 12 contains 0.09 to 10 parts by volume of the carbon nanotubes with respect to 100 parts by volume of the aluminum or aluminum alloy powder, and the composite powder of the third billet contains 0 to 0.08 part by volume of the carbon nanotubes with respect to 100 parts by volume of the aluminum or aluminum alloy powder.

Alternatively, the second billet 12 is made of the composite powder, and the third billet 13 is a metal mass or powder selected from the group consisting of aluminum, copper, magnesium, titanium, stainless steel, tungsten, cobalt, nickel, tin, and alloys thereof.

Of the total volume of the composite billet, the second billet accounts for 0.01 to 10 vol %, the third billet accounts for 0.01 to 10 vol %, and the first billet 11 accounts for the rest.

In the case of making a heat sink from the multi-layered billet structured as described above using a direct extrusion process, it is possible to locally enhance the strength of a portion having a relatively small thickness.

On the other hand, since the second billet or the third billet of the multi-layered billet is made of the composite powder, the multi-layered billet is compressed at a high pressure of 10 to 100 MPa in step S20-2 before being enclosed.

Since the multi-layered billet is compressed, it is possible to directly extrude the multi-layered billet using an extrusion die in the next step. When the pressure for compressing the composite powder is less than 10 MPa, there is a possibility that pores occur in the manufactured aluminum-based clad heat sink and the composite powder flows down. When the pressure exceeds 100 MPa, the second billet (meaning second and onward billets) is likely to expand.

Further, since the second billet and/or the third billet of the multi-layered billet is made of the composite powder, a process of sintering the multi-layered billet is performed in step S20-3 to enable direct extrusion of the multi-layered billet.

A spark plasma sintering apparatus or a hot press sintering is used for the sintering in the invention. However, any sintering apparatus can be used as long as the same object can be achieved. However, when it is necessary to precisely sinter the multi-layered billet in a short time, it is preferable to use discharge plasma sintering. In this case, the discharge plasma sintering is performed at a temperature of 280° C. to 600° C. and a pressure of 30 to 100 MPa for a duration of 1 second to 30 minutes.

Next, the multi-layered billet is directly extruded using an extrusion die to produce an aluminum-based clad heat sink in step S30.

The extrusion die is a solid die, a hollow die, or a semi-hollow die.

The direct extrusion is performed at an extrusion rate of 2 to 10 mm/s and an extrusion pressure of 150 to 150 to 200 kg/cm$^2$, and a billet temperature of 350° C. to 550° C. The extrusion ratio is the ratio of the cross-sectional area of the billet to the cross-sectional area of the aluminum-based clad heat sink.

On the other hand, when the second billet and/or the third billet (meaning second and onward billets) of the multi-layered billet is made of the composite powder, in order to directly extrude the multi-layered billet using the extrusion die, it is necessary to compress or sinter the multi-layered billet at a high pressure as described above.

The method of manufacturing an aluminum-based clad heat sink, according to the present invention, may further include a post-treatment process such as heat treatment. In the case where the aluminum-based clad heat sink is manufactured by the method described above, a better heat treatment effect can be obtained even when the heat treatment is performed under general heat treatment conditions.

An aluminum-based clad heat sink according to another embodiment of the present invention can be manufactured by the using above-described manufacturing method.

FIGS. 4 to 8 are photographs and diagrams illustrating a heat sink manufactured by the manufacturing method of the present invention.

The shape of the heat sink manufactured by the manufacturing method of the present invention is not particularly limited. For example, the heat sink manufactured by the manufacturing method of the present invention may be a fin-type heat sink (see FIG. 4) or a bar-type heat sink (see FIGS. 5 to 8).

Figure 4:
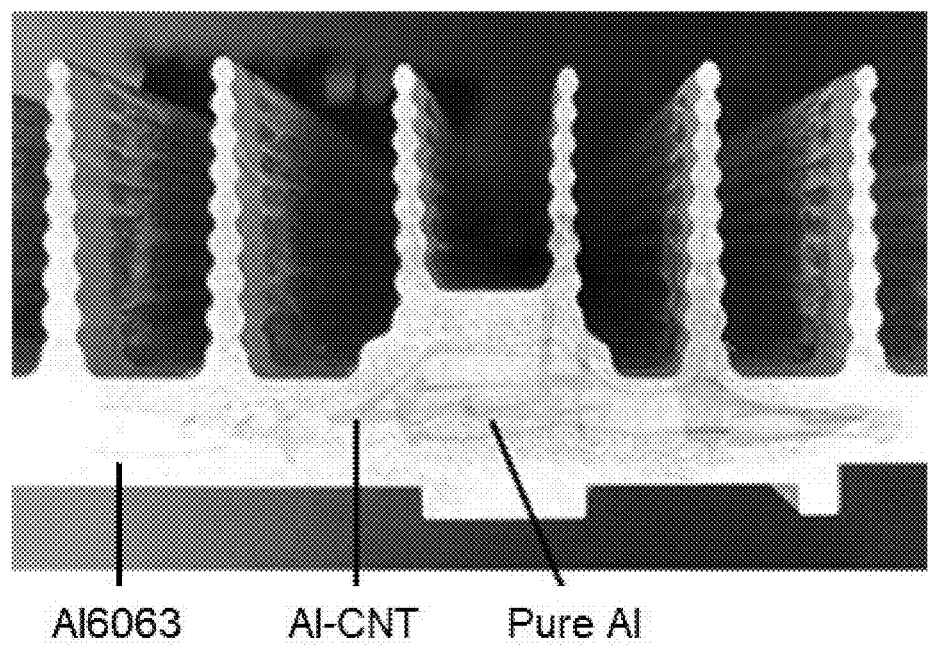
FIG. 4 is a photograph of an aluminum-based clad heat sink manufactured by the method according to one embodiment of the present invention.
Figure 5:
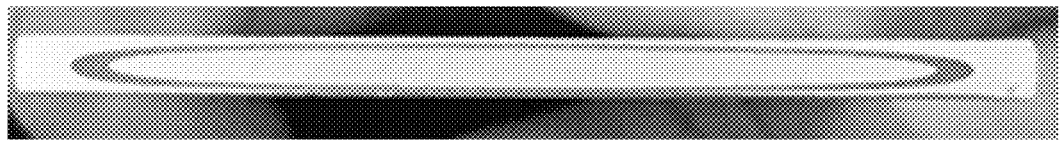
FIG. 5 is a photograph of a bar-type heat sink manufactured by the method according to one embodiment of the present invention.
Figure 6:
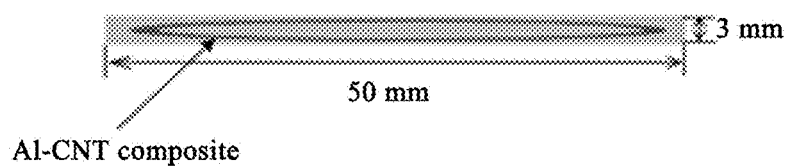
FIG. 6 is a longitudinal cross-sectional view of a bar-type heat sink manufactured by the method according to one embodiment of the present invention.
Figure 7:
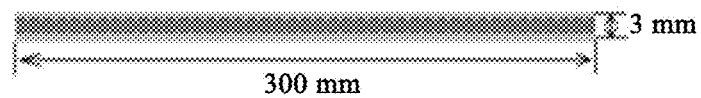
FIG. 7 is a longitudinal side view of a bar-type heat sink manufactured by the method according to one embodiment of the present invention.
Figure 8:
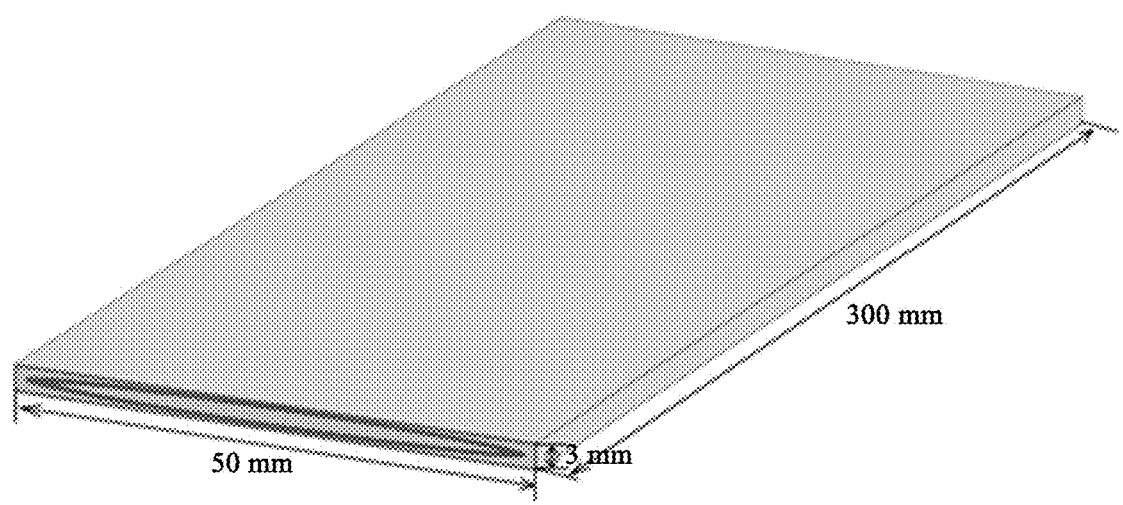
FIG. 8 is a perspective view of a bar-type heat sink manufactured by the method according to one embodiment of the present invention.

The heat sink illustrated in FIG. 4 is a straight fin-type (SF-type) heat sink including a main body and a plurality of fins extending from the main body. The heat sink illustrated in FIGS. 5 to 8 is a bar-type heat sink. The main body of the bar-type heat sink includes an outer layer, an inner layer, and an intermediate layer positioned between the outer layer and the inner layer.

For example, the outer layer is made of aluminum 6063 (Al6063), the inner layer is made of aluminum 3003 (Al3003), and the intermediate layer is made of the Al-CNT composite powder (Al-CNT) described above. In addition, the multiple fins of the heat sink are made of aluminum 6063 (Al6063).

Each of the heat sinks is manufactured by: preparing a multi-layered billet including a first billet having a hollow cylindrical shape and made of aluminum 6063, a third billet having a solid cylinder shape, made of aluminum 3003, and disposed in the first billet, and a second billet which is the composite powder infilled between the first billet and the third billet; and compressing or sintering the multi-layered billet, and directly extruding the multi-layered billet.

Hereinafter, the present invention will be described in detail with reference to examples.

Examples according to the present invention can be modified in various other forms, and the scope of the present invention is not construed as being limited to the examples described below. Examples are provided to more fully describe the present invention to the ordinarily skilled in the art.

[Example and Comparative Example: Preparation of SF-Type Aluminum-Based Clad Heat Sink]

(Example 1)

Carbon nanotubes (manufactured by SCSiAl headquartered in Luxembourg) having a purity of 99.5%, a diameter of 10 nm or less, and a length of 30 μm or less were used. Aluminum powder (manufactured by MetalPlayer headquartered in Korea) having an average particle size of 45 μm and a purity of 99.8% was used.

A multi-layered billet was manufactured such that a third billet having a columnar shape was positioned at the center of a metal can serving as a first billet and a second billet (composite powder) was positioned between the first billet and the third billet.

The second billet included aluminum-CNT composite powder containing 0.1 part by volume of the carbon nanotube with respect to 100 parts by volume of the aluminum powder. The first billet was made of aluminum 6063, and the third billet was made of aluminum 3003.

The second billet was manufactured in manner described below. 100 parts by volume of the aluminum powder and 0.1 parts by volume of the carbon nanotubes were introduced into a stainless steel container to fill 30% of the total volume of the stainless steel. Stainless steel milling balls (a mixture of balls having a diameter of 20 mm and balls having a diameter of 10 mm) were introduced into the container by 30% of the total volume of the container, and 50 ml of heptane was added to the mixture in the stainless steel container. The mixture was ball-milled at a low speed of 250 rpm for 24 hours using a horizontal ball mill. After the completion of the ball milling, the container was opened to allow the heptane to be completely volatilized and the remaining aluminum-CNT composite powder was collected.

The aluminum-CNT composite powder thus prepared was charged into a gap 2.5 t between the first billet and the third billet and compressed at a pressure of 100 MPa to prepare the multi-layered billet.

The multi-layered billet was extruded using a direct extruder under the conditions of an extrusion ratio of 100, an extrusion rate of 5 mm/s, an extrusion pressure of 200 kg/cm$^2$, and a billet temperature of 460° C. to obtain a straight fin-type aluminum clad heat sink.

(Example 2)

In the same manner as in Example 1, an aluminum-CNT composite powder containing the carbon nanotubes in a content of 1 part by volume was prepared and a multi-layered billet was prepared by using the composite powder.

The prepared multi-layered billet was directly extruded under the same conditions as in Example 1 to produce an aluminum-based clad heat sink of straight fin type.

(Example 3)

In the same manner as in Example 1, an aluminum-CNT composite powder containing the carbon nanotubes in a content of 3 parts by volume was prepared and a multi-layered billet was prepared by using the composite powder.

The prepared multi-layered billet was directly extruded under the same conditions as in Example 1 to produce an aluminum-based clad heat sink of straight fin type.

(Comparative Example 1)

An aluminum-CNT mixture of 10 wt % of the CNT and 80 wt % of the aluminum powder was mixed with a dispersion agent (a 1:1 mixture of solvent and natural rubber solution) in a ratio of 1:1 and then exposed to ultrasonic waves for 12 minutes to produce a dispersion mixture. The dispersion mixture was heat-treated in an inert ambient at a temperature of 500° C. in a tubular furnace for 1.5 hours to completely remove the dispersion agent to prepare an aluminum-CNT composite powder.

The aluminum-CNT composite powder thus prepared was charged into an aluminum can having a diameter of 12 mm and a thickness of 1.5 mm to fill the aluminum can. The composite powder was extruded by a hot extruder (model UH-500 kN, Shimadzu Corporation, Japan) at an extrusion temperature of 450° C. and an extrusion ratio of 20 to produce of an aluminum-based clad heat sink of straight fin type. That is, the aluminum-based clad heat sink was manufactured through hot powder extrusion.

[Experimental Example 1: Measurement of Mechanical Properties of Aluminum-Based Clad Heat Sink]

The tensile strength, elongation, and Vickers hardness of the aluminum-based clad heat sinks prepared according to Examples 1 to 3 and Comparative Example 1 were measured, and the results are shown in Table 1.

The tensile strength and elongation were measured according to the Korean Industrial Standard (KS), under test conditions of a tensile speed of 2 mm/s. Test specimens were prepared according to KS B0802 No. 4 (test specimen). The Vickers hardness was measured under conditions of 300 g and 15 seconds.

TABLE 1

|  | Tensile Strength (MPa) | Elongation (%) | Vickers Hardness (Hv) |
|---|---|---|---|
| Example 1 | 165 | 21 | 38 |
| Example 2 | 203 | 18 | 68 |

TABLE 1-continued

|  | Tensile Strength (MPa) | Elongation (%) | Vickers Hardness (Hv) |
|---|---|---|---|
| Example 3 | 195 | 15 | 60 |
| Comparative Example 1 | 190 | 10 | 100 |
| Al6063[1] | 120 | 28 | 30 |
| Al3003[2] | 100 | 31 | 28 |

[1]Al6063: Aluminum 6063
[2]Al3003: Aluminum 3003

Referring to Table 1, the aluminum-based clad heat sink according to Examples 1 to 3 had high strength and high ductility as compared with the aluminum-based clad heat sinks made from a rigid material (Al6063) and a soft material (Al3003).

The aluminum-based clad heat sink according to Comparative Example 1 had a high Vickers hardness but a very low elongation.

[Experimental Example 2: Measurement of Corrosion Resistance of Aluminum-Based Clad Heat Sink]

The corrosion resistance characteristics of the aluminum-based clad heat sinks according to Example 2 and Comparative Example 1 were measured, and the results are shown in Table 2.

The corrosion resistance characteristics were measured by a seawater spraying method for specimens with a size of 10×10 and a thickness of 2 mm according to the CASS standard.

TABLE 2

|  | CASS Corrosion Resistance | Conductivity (W · m$^{-1}$ · K$^{-1}$) |
|---|---|---|
| Example 2 | 400 or more | 268 |
| Comparative Example 1 | 320 | 210 |
| Al6063[1] | 200 | 194 |
| Al3003[2] | 300 | 190 |

[1]Al6063: Aluminum 6063
[2]Al3003: Aluminum 3003

Referring to Table 2, the aluminum-based clad heat sink prepared according to Example 2 exhibited improved corrosion resistance even with a small amount of CNT added, as compared to the aluminum-based clad heat sinks made from a rigid material (A6063) and a soft material (A3003). In addition, the aluminum-based clad heat sink in Comparative Example 1 exhibited a higher value than the pure aluminum alloy, but exhibited a lower value than the aluminum-based clad heat sink prepared according to Example 2.

[Experimental Example 3: Measurement of Corrosion Resistance of Aluminum-Based Clad Heat Sink]

The density, heat capacity, diffusivity, and thermal conductivity of the aluminum-based clad heat sinks prepared according to Example 3 and Comparative Example 1 were measured and the results are shown in Table 3 below.

The density of the aluminum-based clad heat sink was measured on the principle of Archimedes according to the ISO standard. The heat capacity and diffusivity were measured by using a laser flash method using a specimen having a size of 10×10 and a thickness of 2 mm. The thermal conductivity was obtained as the product of measured density×heat capacity×diffusivity.

TABLE 3

| | Density (g/cm³) | Heat Capacity (j/g · K) | Diffusivity (mm³/s) | Conductivity (W · m⁻¹ · K⁻¹) |
|---|---|---|---|---|
| Example 3 | 2.69 | 0.788 | 148 | 294 |
| Comparative Example 1 | 2.7 | 1.1 | 84 | 250 |
| Al6063[1] | 2.7 | 0.9 | 80 | 194 |
| Al1005[2] | 2.7 | 0.9 | 95 | 230 |
| SWCNT[3] | 1.8 or less | 0.7 | 460 | 5300 or less |

[1] Al6063: Aluminum A6063
[2] Al1005: Aluminum A1005
[3] SWCNT: single-walled carbon nanotube Referring to Table 3, the aluminum-based clad heat sink prepared according to Example 3 exhibited a greatly improved thermal conductivity although it contains a small amount of CNT as compared with the aluminum-based clad heat sinks respectively made from a rigid material (A6063) and a soft and highly-conductive material (A1005) which is pure aluminum.

In addition, the aluminum-based clad heat sink in Comparative Example 1 exhibited a higher value than the pure aluminum alloy but exhibited a lower value than the aluminum-based clad heat sink in Example 3.

While the present invention has been illustrated and described with reference to exemplary embodiments thereof, it is to be understood by those skilled in the art that the present invention is not limited to the disclosed exemplary embodiments but rather various modifications and improvements are possible without departing from the basic concept of the present invention. Thus, it should be understood that the modifications, improvements, and equivalents also fall within the scope of the present invention defined by the appended claims.

What is claimed is:

1. A method of manufacturing an aluminum-based clad heat sink, the method comprising:
   (A) preparing a plurality of composite powders by ball-milling (i) aluminum or aluminum alloy powder and (ii) carbon nanotubes (CNT);
   (B) preparing a multi-layered billet using the plurality of composite powders; and
   (C) directly extruding the multi-layered billet using an extrusion die,
   wherein the multi-layered billet comprises a first billet having a can shape and serving as a second shell layer; a second billet disposed inside the first billet as a first shell layer; and a third billet disposed inside the second billet as a core layer,
   wherein the first billet is made of aluminum, and the second billet comprises one of the plurality of composite powders and the third billet comprise another one of the plurality of composite powders, and
   wherein the second billet comprises 0.09 to 10 parts by volume of the carbon nanotubes with respect to 100 parts by volume of the aluminum or aluminum alloy powder, and the third billet comprises 0.08 part by volume of the carbon nanotubes with respect to 100 parts by volume of the aluminum or aluminum alloy powder.

2. The method according to claim 1, wherein in the step (B), the preparing of the multi-layered billet comprises compressing at least one of the plurality of composite powders at a high pressure of 10 to 100 MPa.

3. The method according to claim 1, wherein in the step (B), the preparing of the multi-layered billet comprises subjecting at least one of the plurality of composite powders to spark plasma sintering performed at a pressure of 30 to 100 MPa and a temperature of 280° C. to 600° C. for a duration of 1 second to 30 minutes.

4. The method according to claim 1, wherein the ball-milling in the step (A) is performed at a low speed ranging from 150 to 300 rpm or a high speed of 300 or more rpm, for a duration of 12 to 48 hours, with 100 to 1500 parts by volume of milling balls and 10 to 50 parts by volume of an organic solvent with respect to 100 parts by volume of each of the plurality of composite powders, in a horizontal or planetary ball mill.

5. The method according to claim 4, wherein the organic solvent is heptane.

6. An aluminum-based clad heat sink comprising an extruded multi-layered billet, wherein the multi-layered billet comprises a first billet having a can shape and serving as a second shell layer; a second billet disposed inside the first billet as a first shell layer; and a third billet disposed inside the second billet as a core layer,
   wherein the first billet is made of aluminum, the second billet comprises 0.09 to 10 parts by volume of carbon nanotubes with respect to 100 parts by volume of an aluminum or aluminum alloy powder, and the third billet comprises 0.08 part by volume of carbon nanotubes with respect to 100 parts by volume of the aluminum or aluminum alloy powder
   wherein the aluminum-based clad heat sink is produced by the method of claim 1.

7. The heat sink according to claim 6, wherein the heat sink is a fin-type heat sink or a bar-type heat sink.

8. The heat sink according to claim 7, wherein the heat sink is a straight fin-type heat sink or a pin fin-type heat sink.

* * * * *